(12) United States Patent
Chen

(10) Patent No.: US 10,422,816 B2
(45) Date of Patent: Sep. 24, 2019

(54) ELECTRICAL CONNECTOR AND CONTACTS THEREOF

(71) Applicant: FOXCONN INTERCONNECT TECHNOLOGY LIMITED, Grand Cayman (KY)

(72) Inventor: Ming-Yue Chen, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 949 days.

(21) Appl. No.: 14/806,914

(22) Filed: Jul. 23, 2015

(65) Prior Publication Data

US 2016/0025775 A1 Jan. 28, 2016

(30) Foreign Application Priority Data

Jul. 23, 2014 (TW) .............................. 103125202 A

(51) Int. Cl.
*H05K 7/10* (2006.01)
*H01R 13/62* (2006.01)
*G01R 1/04* (2006.01)
*H01R 13/24* (2006.01)

(52) U.S. Cl.
CPC ......... *G01R 1/0416* (2013.01); *G01R 1/0433* (2013.01); *H01R 13/2421* (2013.01); *H05K 7/10* (2013.01); *H05K 7/1061* (2013.01); *H01R 2201/20* (2013.01)

(58) Field of Classification Search
CPC .. H01R 13/2421; H01R 2201/20; H05K 7/10; H05K 7/1061

USPC .......................................................... 439/331
See application file for complete search history.

(56) References Cited

U.S. PATENT DOCUMENTS

| 5,290,193 A | 3/1994 | Goff et al. |
| 6,821,131 B2* | 11/2004 | Suzuki .............. H01R 13/2421 |
| | | 439/700 |
| 6,948,945 B2* | 9/2005 | Chen .................... H01R 13/112 |
| | | 439/141 |

(Continued)

FOREIGN PATENT DOCUMENTS

| CN | 201029138 | 2/2008 |
| CN | 201303096 Y | 9/2009 |

(Continued)

*Primary Examiner* — Edwin A. Leon
*Assistant Examiner* — Milagros Jeancharles
(74) *Attorney, Agent, or Firm* — Wei Te Chung; Ming Chieh Chang

(57) ABSTRACT

An electric contact used to electrically connecting an IC socket to a PCB, comprises an upper contact, a lower contact and an elastic member between them. The upper contact comprises a first connecting portion to be connected to the IC socket and a first contacting portion with less length than the first connecting portion. The lower contact comprises a second connecting portion and a second contacting portion connecting with the second connecting portion. The second connecting portion includes an expanding portion adjacent to the second contacting portion. The second contacting portion forms a receiving space for the first contacting portion. The first connecting portion also defines a protruding portion projecting along a thickness direction.

2 Claims, 7 Drawing Sheets

(56) References Cited

U.S. PATENT DOCUMENTS

| | | | | |
|---|---|---|---|---|
| 7,559,769 B2* | 7/2009 | Hsiao | ............. | H05K 7/1069 439/66 |
| 7,658,656 B2* | 2/2010 | Hsu | ............. | H01R 13/2421 324/755.05 |
| 7,753,704 B2* | 7/2010 | Chen | ............. | H01R 13/2442 439/268 |
| 7,789,671 B2* | 9/2010 | Hsieh | ............. | G01R 1/06722 439/66 |
| 7,841,864 B2* | 11/2010 | Hsiao | ............. | H01R 13/2421 439/66 |
| 7,922,537 B2* | 4/2011 | Chang | ............. | H01R 12/57 439/607.05 |
| 8,087,955 B2 | 1/2012 | Kazama et al. | | |
| 8,519,727 B2* | 8/2013 | Yamamoto | ......... | G01R 1/06722 324/755.05 |
| 8,710,856 B2* | 4/2014 | Swart | ............. | G01R 1/06722 324/538 |
| 8,715,015 B2* | 5/2014 | Hwang | ............. | G01R 1/06722 439/700 |
| 8,721,372 B2* | 5/2014 | Hasegawa | ............ | G01R 1/0483 439/66 |
| 8,979,564 B2* | 3/2015 | Sandhu | ............. | H01R 13/64 29/874 |
| 9,684,031 B2* | 6/2017 | Suzuki | ............. | G01R 1/06722 |
| 9,797,925 B2* | 10/2017 | Teranishi | ............. | G01R 1/067 |
| 9,829,506 B2* | 11/2017 | Treibergs | ............ | G01R 1/06722 |
| 2004/0219816 A1* | 11/2004 | Hou | ............. | H01R 4/02 439/330 |
| 2009/0163069 A1* | 6/2009 | Chen | ............. | G01R 1/0466 439/331 |
| 2010/0029112 A1* | 2/2010 | Goa | ............. | G01R 1/0466 439/259 |
| 2010/0221929 A1* | 9/2010 | Chen | ............. | G01R 1/0466 439/74 |

FOREIGN PATENT DOCUMENTS

| | | |
|---|---|---|
| CN | 201478605 | 5/2010 |
| TW | 475298 | 2/2002 |
| TW | M344664 | 11/2008 |
| TW | M395930 | 7/2009 |
| TW | M373057 | 1/2010 |
| TW | I423532 | 3/2013 |

* cited by examiner

ELECTRICAL CONNECTOR AND CONTACTS THEREOF

1. FIELD OF THE INVENTION

The present invention relates to an electrical connector, and more particularly to an electrical connector used for testing.

2. DESCRIPTION OF RELATED ARTS

An electrical connector for electrically connecting an IC socket to a printed circuit board to test the IC socket. The electrical connector comprises a housing, a shell mounted to the housing, a body located in the housing and a plurality of contacts received in the body. The contact is in a form of "C" shape. When the IC socket is inserting into the electrical connector, the contact has an elastic deformation and an elastic force keeps the IC socket mating with the electrical connector. However, when the contact is deflecting, a shot circuit will occur. This will damage the electrical connector and the IC socket.

Therefore, an electrical connector with improved structure is desired.

SUMMARY OF THE INVENTION

An electrical contact for electrically connecting an IC socket to a printed circuit board comprises an upper contact, a lower contact and an elastic member located between them. The upper contact has a first connecting portion to be connected to the IC socket and a first contacting portion with less width than the first connecting portion to connect with the first connecting portion. The lower contact comprises a second connecting portion to be connected to the printed circuit board and a second contacting portion connecting with the second connecting portion, the second connecting portion has an expanding portion adjacent to the second contacting portion, the second contacting portion forms a receiving space for receiving the first contacting portion. The elastic member receives the first contacting portion therein and is located between the first connecting portion of the upper contact and the second contacting portion of the lower contact. The first connecting portion defines a protruding portion projecting along a thickness direction thereof.

An electrical connector for electrically connecting an IC socket to a printed circuit board comprises a housing, a shell, a locking member, a contact holding member and an electrical contact. The housing has a frame with a hollow, the shell is connected to and sliding along the housing. The locking member has a fixing end fixed in the shell and a turning end turning around the fixing end when the shell is sliding. The contact holding member is fixed in the hollow and defining a plurality of contact slots. The electrical contact has an upper contact, a lower contact and an elastic member located between them. The upper contact has a first connecting portion to be connected to the IC socket and a first contacting portion with less width than the first connecting portion to connect with the first connecting portion. The lower contact has a second connecting portion to be connected to the printed circuit board and a second contacting portion connecting with the second connecting portion, the second connecting portion has an expanding portion adjacent to the second contacting portion, the second contacting portion forms a receiving space for receiving the first contacting portion, the expanding portion is fixed in the contact slot.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
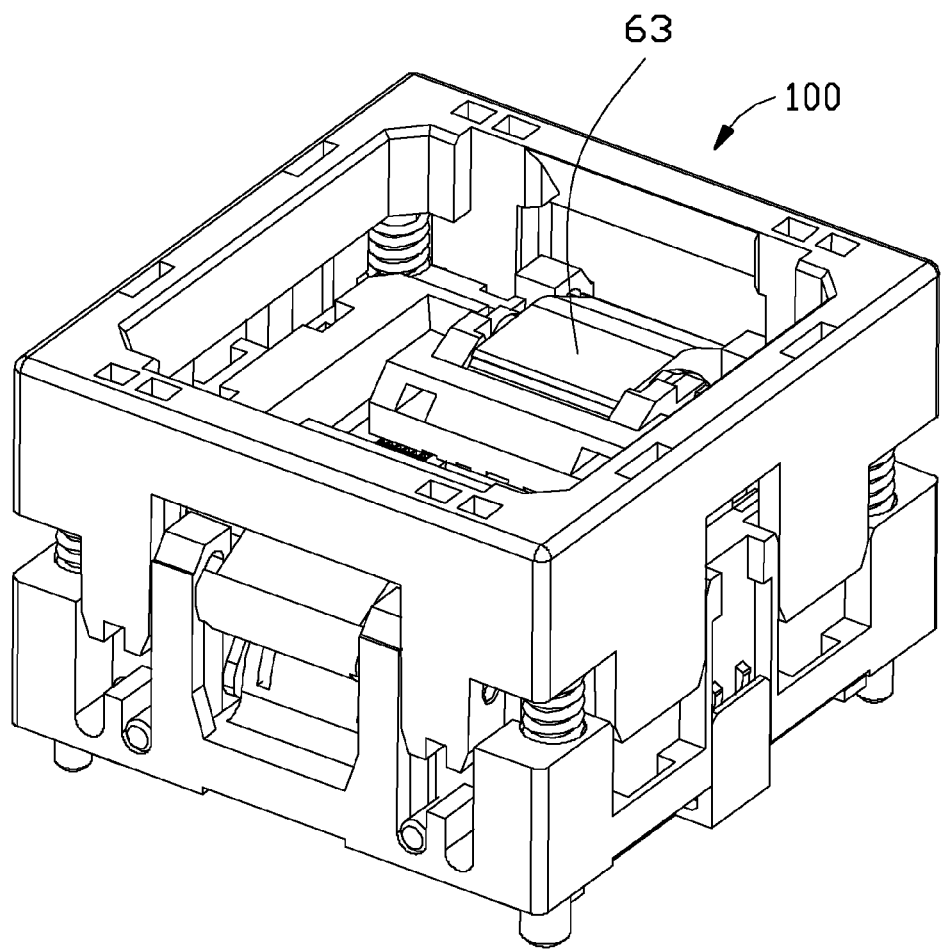
FIG. 1 is a perspective view of an electrical connector with a locking portion being closed in accordance with the present invention.

Reference will now be made to the drawing figures to describe the present invention in detail.

Figure 2:
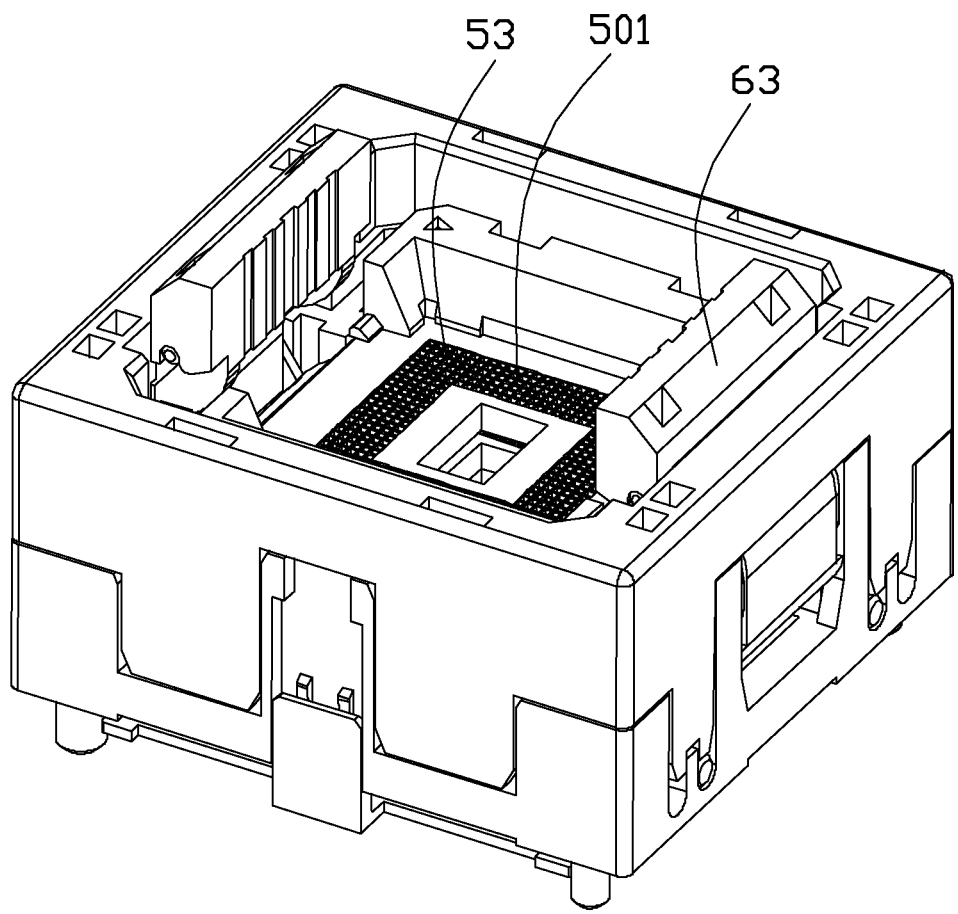
FIG. 2 is a perspective view of the electrical connector with a locking portion being opened in accordance with the present invention.
Figure 3:
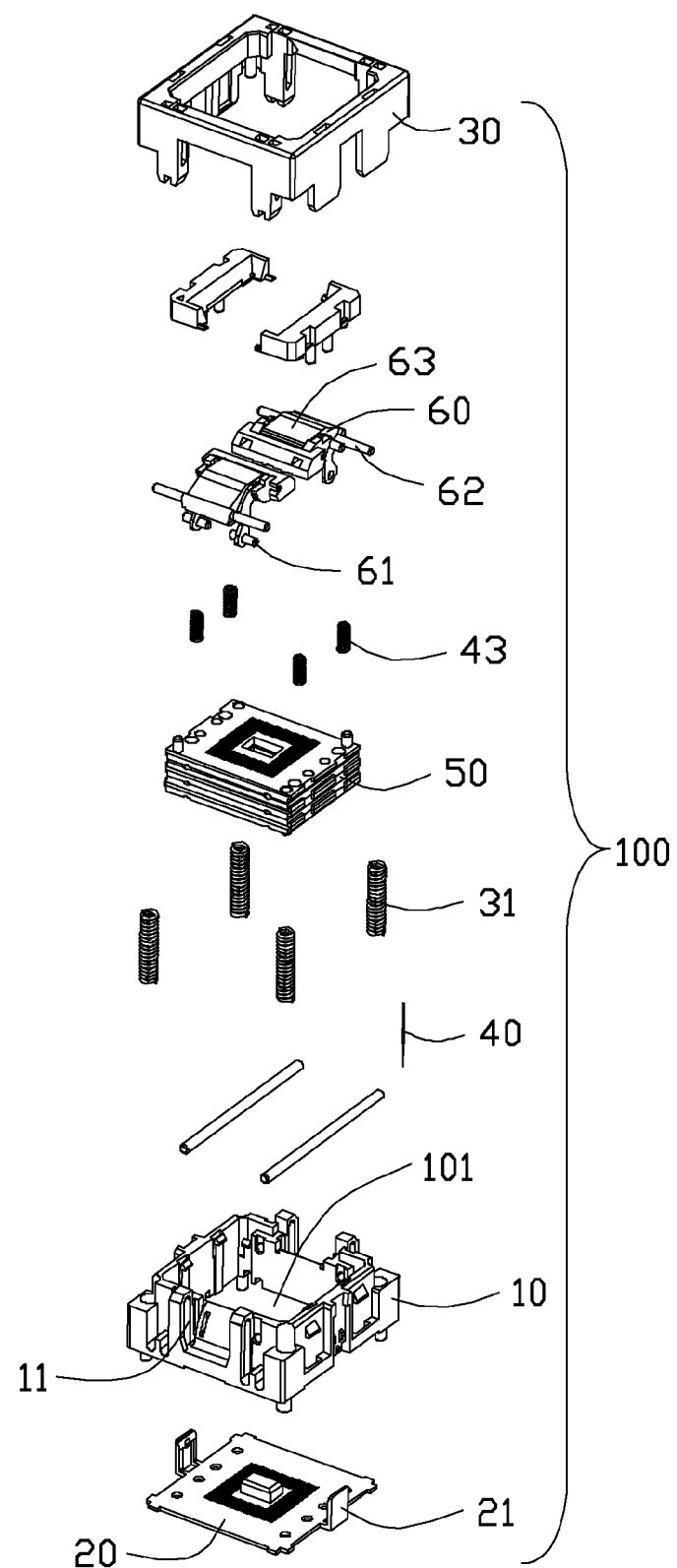
FIG. 3 is an exploded view of the electrical connector as shown in FIG. 1.

FIG. 1 to FIG. 3 show a testing electrical connector 100 for electrically connecting an IC socket to a printed circuit board, the connector comprises a housing 10, a bottom plate 20 mounted in the bottom of the housing 10, a shell 30 mounted in the top of the housing 10 and sliding along the housing 10 in an up-to-down direction, a plurality of contacts 40 running through the bottom plate 20 to be soldered to the printed circuit board through the bottom plate 20 and a holding member 50 for holding the contacts 40.

The housing 10 being in a form of a frame with a hollow comprises an inner cavity 101 extending through the housing 10 along the up-to-down direction. The bottom plate 20 is mounted to the housing 10 along a down-to-up direction, the bottom plate 20 includes a pair of latching arms 21 locked at two sides of the housing 10 respectively. The shell 30 is mounted to the housing 10 along the up-to-down direction and fixed to the housing 10 by an elastic member 31, the shell 30 can compress the elastic member 31 and move downwardly.

The electrical connector 100 also includes a pair of locking portions 60. The locking portion 60 includes a locking arm 63, a first pivot 61 and a second pivot 62 mounted in one end of the locking arm 63. The housing 10 has a plurality of vertical guiding rails 11 at both front and rear sides. The first pivot 61 is received in the guiding rail 11, the second pivot 62 is connected to the shell 30. When the shell 30 is moving along the housing 10 upwardly or downwardly, the locking arm 63 will rotate around the first pivot 61 and the IC socket will be locked or unlocked.

Referring to FIG. 3, the holding member 50 includes an upper holding member 51, a lower holding member 52 and a supporting member 53 located above the upper holding member 51. In other embodiments, the holding member 50 can have no supporting member 53. The upper holding member 51 includes a rectangle first holding member 511 and a rectangle second holding member 512, the first holding member 511 has two cylinders 513 protruding from a lower surface in two diagonal corners respectively, the second holding member 512 has two holes 514 in an upper surface used for receiving the cylinders 513 respectively. This prevents a relative movement of the first holding member 511 and the second holding member 512. Of course, two other diagonal corners of the first holding member 511 can have two holes respectively, the second holding member has two cylinders for being received in the two holes, this makes the holding effect better. The lower holding member 52 includes a third holding member 521 and a fourth holding member 522, the holding manner of the third holding member 521 and the fourth holding member 522 is similar to the holding manner of the first holding member 511 and the second holding member 512. The holding member 50, the bottom plate 20 and the supporting member 53 form a contact slot 501 commonly for receiving the contact 40. In other words, the contact slot 501 extends through the holding member 50, the bottom plate 20 and the supporting member 53.

Figure 4:
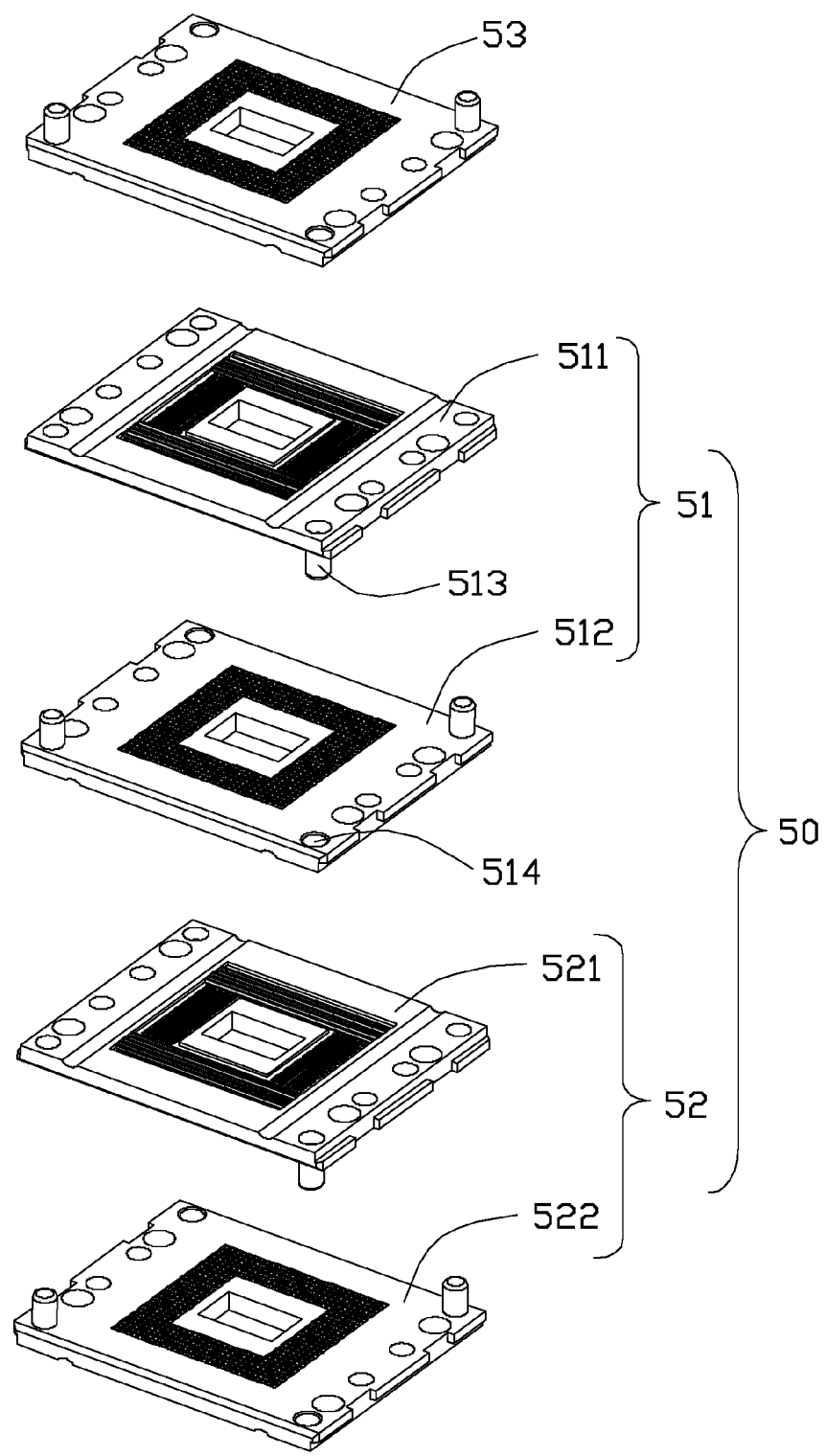
FIG. 4 is a perspective view of a holding member of the electrical connector.
Figure 5:
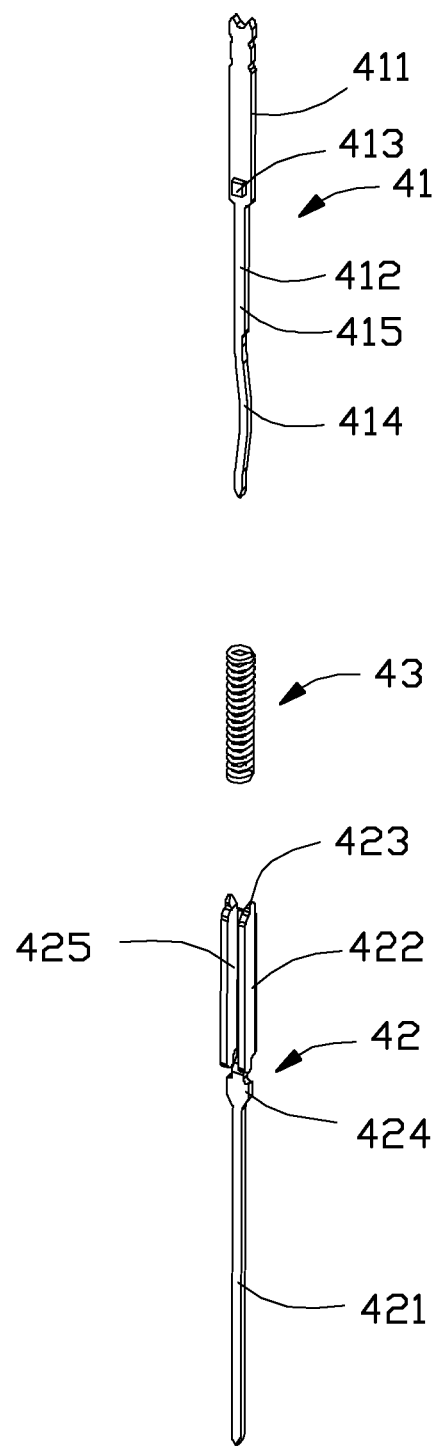
FIG. 5 is an exploded view of an electrical contact.
Figure 7:
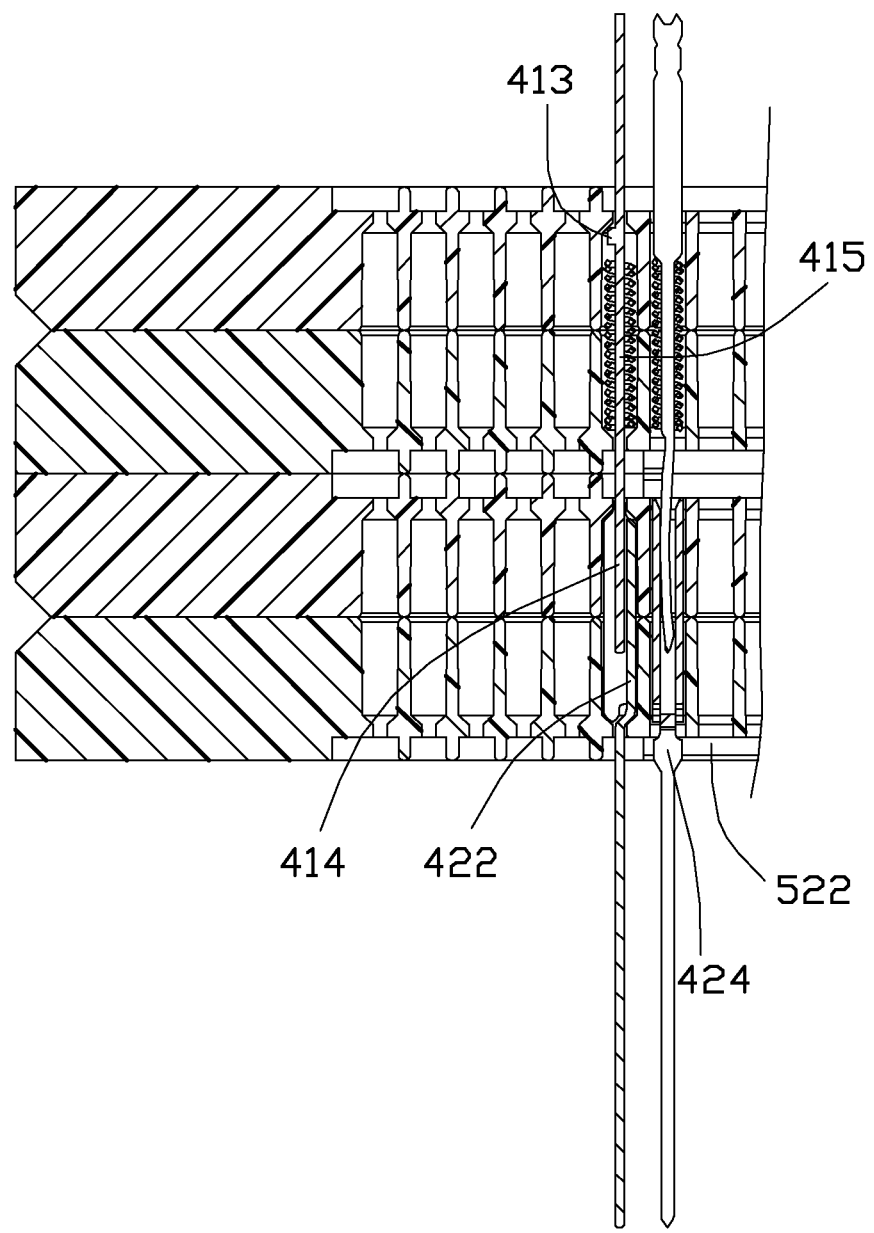
FIG. 7 is a partly cross sectional view of the electrical connector with an IC socket being mounted into.

Referring to FIG. 4 and FIG. 5, the contact 40 includes an upper contact 41, a lower contact 42 and a spring 43 located therebetween. The upper contact 41 includes an upper portion or a first connecting portion 411 and a lower portion or a first contacting portion 412 with less width than the first connecting portion to connect with the first connecting portion, the first contacting portion 412 has a first contacting end 414 with less width, the first contacting end 414 is in an arc shape. The first contacting portion 412 comprises a bridging portion 415 connecting to the first connecting portion 411 and a first contacting end 414 of a circular arc shape. The first contacting end 414 and the bridging portion 415 are in the same plane. The first connecting portion 411 defines a protruding portion 413 projecting along a thickness direction thereof The lower contact 42 includes a second connecting portion 421 and a second contacting portion 422 connecting each other, the second contacting portion 422 forms a receiving space 425 for receiving the first contacting end 414. The second contacting portion 422 has a tip 423 with smaller size. The spring 43 receives the first contacting portion 412. The spring 43 is located between the first connecting portion 411 and the second contacting portion 422. The second connecting portion 421 has an expanding portion 424 adjacent to the second contacting portion 422. Referring to FIG. 7, the expanding portion 424 is locked in the fourth holding member 522, this prevents the second connecting portion 421 from moving and avoids damaging a soldering between the second connecting portion 421 and the printed circuit board.

Figure 6:
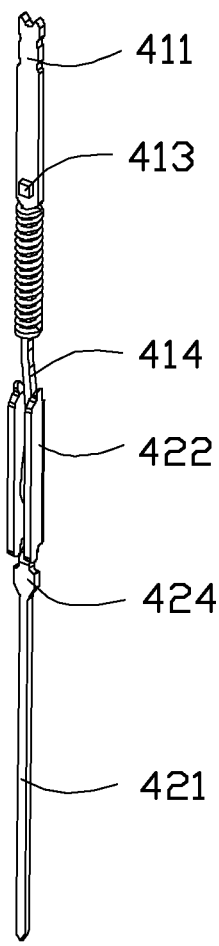
FIG. 6 is an assembled view of the electrical contact as shown in FIG. 5.

Referring to FIG. 5 to FIG. 7, the assembling process of the contact 40 and the holding member 50 is introduced as below. The upper contact 41 is inserted into the second holding member 512 along the up-to-down direction, the first holding member 511 is mounted to the second holding member 512 from a top of the upper contact 41 and until a lower surface of the first holding member 511 pressing an upper surface of the second holding member 512. The protruding portion 413 as a stopper, is locked in an upper end of the contact slot 501. The combination of the upper contacts 41 in the upper holding member 51 is deemed the upper contact assembly. The assembling process of the lower contact 42 is similar to the assembling process of the upper contact 41 as above. The lower contact 42 is mounted to the fourth holding member 522 firstly and mounted to the third holding member 521 secondly, then the expanding portion 424 is locked in a lower opening of the contact slot 501. The combination of the lower contacts 42 in the lower holding member 52 is deemed the lower contact assembly. When the upper contact 41 and the lower contact 42 are mounted together, the upper holding member 51 mates with the lower holding member 52, the first contacting portion 412 mates with the second contacting portion 422, the first contacting end 414 is received in the receiving space 425. The first connecting portion 411 extends through the supporting member 53 and beyond an upper surface of the supporting member 53 to mate with the IC socket. The second connecting portion 421 extends through the bottom plate 20 and beyond a bottom surface of the housing 10 to connect with the printed circuit board. The adjacent contacts are perpendicular to each other.

Referring to FIG. 2, When the shell 30 is pressed, the locking portion 60 is opened and the IC socket can be mounted into the electrical connector 100. Referring to FIG. 1, when the shell 30 is not pressed, the locking portion 60 is closed. One feature of the invention is to provide the self-retained upper contact assembly with the upper contacts 41 retained within the upper holding member 51, and the self-retained lower contact assembly with the lower contacts 42 retained within the lower holding member 52, and when the upper contact assembly is intimately mounted upon the lower contact assembly, the upper contacts 41 may mechanically and electrically connected to the corresponding lower contacts, respectively, in a floating manner wherein the lower contacts 42 are immovably retained in the lower holding member 52 while the upper contacts 41 are up and down moveable within the upper holding member 51 due to the spring 43. From the technical viewpoint, the upper contact assembly and the lower contact assembly may be independently pre-assembled individually and successively further assembled together in a stacking manner easily, compared with the traditional one using the opposite upper housing unit and lower housing unit to commonly sandwich the paired upper and lower contacts therebetween in a tensioned manner due to the springs associated with the paired upper and lower contacts, respectively.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   a lower contact assembly including an insulative lower holding member, a plurality of lower contacts retaining in the lower holding member in a fixed manner;
   an upper contact assembly stacked upon the lower contact assembly in a vertical direction, and including an insulative upper holding member, a plurality of upper contacts retained in the upper holding member in an up-and-down floating manner;
   an upper end section of each of said upper contacts extending upwardly above an upper face of the upper holding member for contacting an electronic package, and a lower end section of each of said upper contacts extending downwardly beyond a bottom face of the upper holding member and through an upper face of the lower holding member and further into the lower holding member to mechanically and electrically connect to the corresponding lower contact; and a lower end of each of said lower contacts extending downwardly beyond a bottom face of the lower holding member for connecting to a printed circuit board; wherein each of said upper contacts is equipped with a spring with thereof a lower end that abuts downwardly against a lower portion of the upper holding member and an upper end upwardly abuts an upper portion of the upper contact to urge the upper contact upwardly; wherein said upper holding member includes a first holding member and second holding member opposite to each other to commonly sandwich the upper contacts and the associated springs therebetween in the vertical direction; wherein the first holding member and the second holding member are essentially same with each other.

2. An electrical connector comprising:

a lower contact assembly including an insulative lower holding member, a plurality of lower contacts retaining in the lower holding member in a fixed manner;

an upper contact assembly stacked upon the lower contact assembly in a vertical direction, and including an insulative upper holding member, a plurality of upper contacts retained in the upper holding member in an up-and-down floating manner;

an upper end section of each of said upper contacts extending upwardly above an upper face of the upper holding member for contacting an electronic package, and a lower end section of each of said upper contacts extending downwardly beyond a bottom face of the upper holding member and through an upper face of the lower holding member and further into the lower holding member to mechanically and electrically connect to the corresponding lower contact; and a lower end of each of said lower contacts extending downwardly beyond a bottom face of the lower holding member for connecting to a printed circuit board; wherein each of said upper contacts is equipped with a spring with thereof a lower end that abuts downwardly against a lower portion of the upper holding member and an upper end upwardly abuts an upper portion of the upper contact to urge the upper contact upwardly; wherein the upper holding member and the lower holding member are essentially same with each other.

* * * * *